United States Patent [19]
Johnson

[11] Patent Number: 5,560,957
[45] Date of Patent: Oct. 1, 1996

[54] ELECTROLUMINESCENT DEVICE

[75] Inventor: Gordon E. Johnson, Webster, N.Y.

[73] Assignee: Xerox Corporation, Stamford, Conn.

[21] Appl. No.: 330,451

[22] Filed: Oct. 28, 1994

[51] Int. Cl.$^6$ ..................................................... B05D 5/17
[52] U.S. Cl. .................. 427/66; 427/226; 427/380; 427/385.5; 427/389.7; 427/407.2; 427/419.5; 427/407.1
[58] Field of Search ................. 427/66, 226, 64, 427/280, 385.5, 389.7, 401.1, 407.2, 419.5

[56] References Cited

U.S. PATENT DOCUMENTS

| | | | |
|---|---|---|---|
| 4,356,429 | 10/1982 | Tang | 313/503 |
| 4,429,051 | 1/1984 | Davidge et al. | 501/12 |
| 4,769,292 | 9/1988 | Tang et al. | 428/690 |
| 4,806,443 | 2/1989 | Yanus et al. | 430/56 |
| 4,806,444 | 2/1989 | Yanus et al. | 430/56 |
| 4,818,650 | 4/1989 | Limburg et al. | 430/56 |
| 4,920,093 | 4/1990 | Nonaka et al. | 505/1 |
| 4,921,731 | 5/1990 | Clark et al. | 427/314 |
| 4,931,312 | 6/1990 | deLeeuw et al. | 427/64 |
| 4,950,950 | 8/1990 | Perry et al. | 313/504 |
| 4,965,091 | 10/1990 | Fratello et al. | 427/64 |
| 5,030,532 | 7/1991 | Limburg et al. | 430/56 |
| 5,073,446 | 12/1991 | Scozzafava et al. | 428/323 |
| 5,116,703 | 5/1992 | Badesha et al. | 430/59 |
| 5,132,253 | 7/1992 | Dawes | 501/12 |
| 5,316,695 | 5/1994 | Wilkes et al. | 252/315.6 |

FOREIGN PATENT DOCUMENTS

WO90/13148  11/1990  WIPO.

OTHER PUBLICATIONS

T. S. Perry et al., "Computer Displays: New Choices, New Tradeoffs," *IEEE Spectrum*, vol. 22, No. 7, pp. 52–59, 1985 (no mo.).

L. E. Tannas et al., "Electroluminescence Catches the Public Eye," *IEEE Spectrum*, vol. 23, vol. 10, Oct. 1986, pp. 37–42.

L. E. Tannes, "Flat–panel Displays Displace Large, Heavy, Power–Hungry CRTs," vol. 26, No. 9, Sep. 1989, pp. 34–35.

J. H. Burroughes et al., "Light–emitting Diodes Based on Conjugated Polymers," *Nature*, vol. 347, Oct. 11, 1990, pp. 539–541.

P. S. Vincett et al., "Electrical Conduction and Low Voltage Blue Electroluminescene in Vacuum–Deposited Organic Films," *Thin Solid Films*, 94 (1982) pp. 171–183 (no mo.).

Y. Ohmori et al., "Visible–Light Electroluminescent Diodes Utilizing Poly(3–alkylthiophene)," *Japanese Journal of Applied Physics*, vol. 30, No. 11B, Nov., 1991, pp. 1938–1940.

Y. Ohmori et al., "Blue Electroluminescent Diodes Utilizing Poly(alkylfluorene)," *Japanese Journal of Applied Physics*, vol. 30, No. 11B, Nov., 1991, pp. 1941–1943.

R. H. Friend et al., "Photo–excitation in Conjugated Polymers," *J. Phys. D: Appl. Phys.*, 20 (1987), pp. 1367–1384 (no mo.).

C. Hosokawa et al., "Bright Blue Electroluminescene from Hole Transporting Polycarbonate," *Appl. Phys. Lett.*, 61 (21), Nov. 23, 1992, pp. 2503–2505.

N. C. Greenham et al., "Efficient Light–emitting Diodes Based on Polymers With High Electron Affinities," *Nature*, vol. 365, Oct. 14, 1993, pp. 628–630.

R. H. Partridge et al., "Electroluminescence from Polyvinylcarbazole Films: 4. Electroluminescence Using Higher Work Function Cathodes," *Polymer*, 1983, vol. 24, Jun., pp. 755–762.

D. Braun et al., "Visible Light Emission from Semiconducting Polymer Diodes," *Appl. Phys. Lett.*, 58(18), May 6, 1991, pp. 1982–1984.

D. Braun et al., "Improved Efficiency in Semiconducting Polymer Light–Emitting Diodes," *Journal of Electronic Materials*, vol. 20, No. 11, 1991, pp. 945–948. (no mo.).

A. R. Brown et al., "Poly(p–phenylenevinylene) Light––emitting Diodes: Enhanced Electroluminescent Efficiency Through Charge Carrier Confinement," *Appl. Phys. Lett.* 61 (23), Dec. 7, 1992, pp. 2793–2795.

J. Kido et al., "Poly(methylphenysilane) Film as a Hole Transport Layer in Electroluminescent Devices," *Appl. Phys. Letter*, 59 (21), Nov. 18, 1991, pp. 2760–2762.

H. Reuter, "Sol—Gel Processes II**: Investigation and Application," *Advanced Materials* 3, No. 11, 1991, pp. 568–571. (no mo.).

D. Bloor, "Totally Organic Transistors," *Nature*, vol. 349, Feb. 28, 1991, pp. 738–740.

F. Garnier et al., "An All–Organic Soft Thin Film Transistor With Very High Carrier Mobility," *Adv. Mater.*, 2 (1990) No. 12, pp. 592–594. (no mo.).

C. W. Tang et al., "Electroluminescence of Doped Organic Thin Films," *J. Appl. Phys.*, 65 (9), May 1, 1989, pp. 3610–3616.

C. Adachi et al., "Confinement of Charge Carriers and Molecular Excitons Within 5–nm–thick Emitter Layer in Organic Electroluminescent Devices with a Double Heterostructure," *Appl. Phys. Lett.*, 57 (6), Aug. 6, 1990, pp. 531–533.

*Primary Examiner*—Janyce Bell
*Attorney, Agent, or Firm*—Oliff & Berridge; Eugene O. Palazzo

[57] ABSTRACT

An electroluminescent (EL) device has a ceramic electroluminescent active layer and may be prepared by forming layers by a sol-gel process.

8 Claims, 1 Drawing Sheet

ELECTROLUMINESCENT DEVICE

BACKGROUND OF THE INVENTION

This invention is directed to a method for preparing an organic electroluminescent (EL) device. More specifically, the invention is directed to a sol-gel process for applying an organic layer onto a substrate to prepare an EL device.

BACKGROUND

Electrooptical devices such as cathode ray tubes (CRT's) are known. These devices are large and consume substantial amounts of energy. Efforts have been devoted to replacing CRT's with flat panel devices that consume less energy, for example 20 to 50 volts, and that are easily addressed by an array of thin film transistors such as illustrated by T. S. Perry and P. Wallick, IEEE Spectrum 22 No. 7, 52 (1985); L. E. Tannas, Jr., IEEE Spectrum 23 No. 10, 37 (1986); and L. E. Tannas, Jr., IEEE Spectrum 26 No. 9, 34 (1989).

Electroluminescent flat panel displays based on inorganic materials are known; however such displays require high driving voltages. Further known is the fabrication of organic EL devices such as those based on poly(p-phenylene vinylene), J. H. Burroughes et al., Nature 347, 539 (1990).

U.S. Pat. No. 4,950,950 to Perry et al. shows a multilayer EL device with silane hole transporting agents. U.S. Pat. No. 4,356,429 to Tang illustrates organic EL cells with a hole injecting porphyrinic zone. P. S. Vincett, W. A. Barlow, R. A. Hann and G. G. Roberts, Thin Solid Films 94, 171 (1982); R. H. Partridge, Polymer 24, 755 (1983); J. H. Burroughes et al., Nature, supra; D. Braun and A. J. Heeger, Applied Physics Letters 58, 1982 (1991); D. Braun and A. J. Heeger, J. Electronic Materials 20, 945 (1991); A. R. Brown et al., Applied Physics Letters 61, 2793 (1992); and J. Kido et al., Applied Physics Letters 59, 2760 (1991) disclose other organic EL compositions.

An organic EL device can be formed with an organic emitting layer in conductive contact with an anode that is typically made of a transparent conductor such as indium-tin oxide and a cathode, typically a low work-function metal such as magnesium or calcium. In one configuration, the organic layer is comprised of a host polymer that supports hole injection from the anode and electron injection from the cathode, and is capable of emitting light in response to recombination of holes and electrons. This host polymer can further include a compound that facilitates hole injection, a compound that facilitates electron injection and, optionally, a fluorescent material capable of emitting light in response to recombination of holes and electrons.

In another configuration, the organic layer can comprise two separate layers, the one adjacent to the anode supporting hole injection and transport and the one adjacent to the cathode supporting electron injection and transport. The recombination of charges and subsequent emission of light proceed in one of the layers but near the interface between the layers. Optionally, a fluorescent material can be added to one of the layers in which case the recombination of charges and emission of light proceed in that compound.

In yet another configuration, the organic layer comprises three separate layers; the hole transport layer, the emission layer and the electron transport layer.

Vacuum phase deposition can degrade the performance of luminescent layers based on small molecules. Passage of current through the layers during formation of the EL device generates heat that induces crystallization. Crystallization degrades EL performance. Additionally, vacuum phase deposition limits the types of additives that can be incorporated into the luminescent layers. Vacuum phase deposition is a complicated and costly process requiring elevated temperatures and high vacuum.

Layers of an EL device can be applied by solvent coating techniques. However, known solvent coating techniques for applying layers of an EL device are limited in one or several respects. Many organic materials for an EL device cannot be directly applied because the materials do not dissolve in common film-forming solvents. International Patent Application WO 90/13148 relates to solution coated luminescent layers wherein the organic materials are applied in the form of a sulphonium precursor that is subsequently converted to the desired organic material. The process of WO 90/13148 is disadvantageous because the organic materials are required to be provided in the form of precursors and because the process requires the additional step of converting the materials.

Copending U.S. application Ser. No. 08/313,963, filed Sep. 28, 1994 to Hsieh et al. relates to a solution coated EL device comprising a polymer of a tetraaryl-substituted biphenyldiamine. Advantageously, the Hsieh et al. invention permits forming an EL device that contains hole transport polymer, charge transport material, emitter and additives all in a single organic layer. Even so, problems may be encountered in forming a multilayer organic EL device by solution coating because of mutual solubility of the layers. Solvent for one layer can degrade an already formed layer during a subsequent application step. Organic materials that should be retained in one layer may migrate to other layers.

SUMMARY OF THE INVENTION

The present invention is directed to a method for preparing an EL device. The invention is particularly useful for preparing a multilayer EL device. In the process of the invention, EL organic layers can be solution coated by known processes such as spin casting, dip coating, gravure coating and the like. Vacuum or vapor deposition is avoided. Additionally, the problem of multilayer solubility is avoided. Another advantage is that organic layer additives can be selected that are soluble in the coating solution. According to the invention, an EL device is prepared by forming organic layers by a sol-gel process. Additionally, the invention relates to an electroluminescent device comprising a ceramic electroluminescent-active layer.

DESCRIPTION OF PREFERRED EMBODIMENTS

Illustrated in U.S. Pat. No. 4,769,292 to Tang et al., the disclosure of which is totally incorporated herein by reference, are multilayer EL devices with a luminescent zone of less than one micron in thickness comprising an organic host material, a fluorescent material and cathode and anode electrodes. Examples of components that can be selected for the process of this invention are illustrated therein including host materials in columns 6 to 10, fluorescent dyes in columns 11 to 34, hole transport layers beginning in column 36, electron injecting and transporting compounds beginning in column 36, and the like.

In U.S. Pat. No. 5,073,446 to Scozafava et al., the disclosure of which is totally incorporated herein by reference, there is illustrated a multilayer organic EL device comprised of a support, an anode, an organic electroluminescent medium and a cathode comprised of an electron injecting layer.

U.S. Pat. No. 5,116,703 to Badesha et al., the disclosure of which is totally incorporated herein by reference, relates to materials and a process for producing materials that are useful in electrophotographic imaging members. The materials are produced through a sol-gel process.

Figure 1:
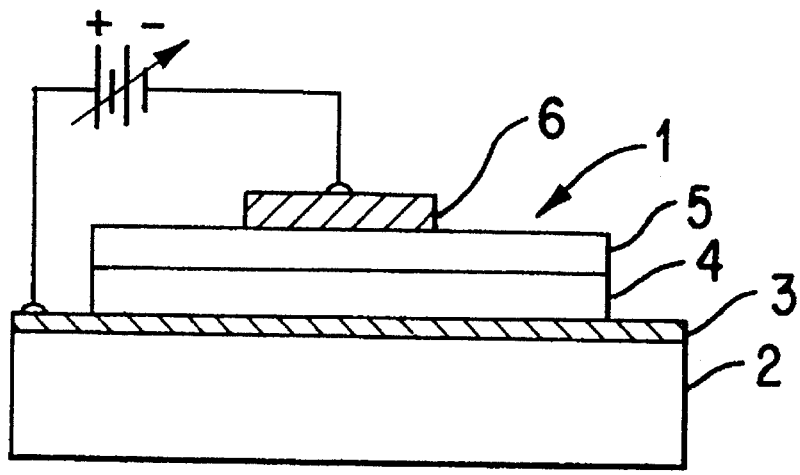
FIGS. 1 and 2 are schematic diagrams of EL devices.

FIG. 1 of the Drawings illustrates a device of the present invention. The EL device of FIG. 1 is a solid state light emitting diode 1 comprised of a supporting substrate 2 of for example glass, an anode 3, a hole injecting conductive layer 4, layer 5 comprised of a hole transport conjugated polymer and an emitter compound and in contact therewith a low work function material as a metal cathode 6.

Figure 2:
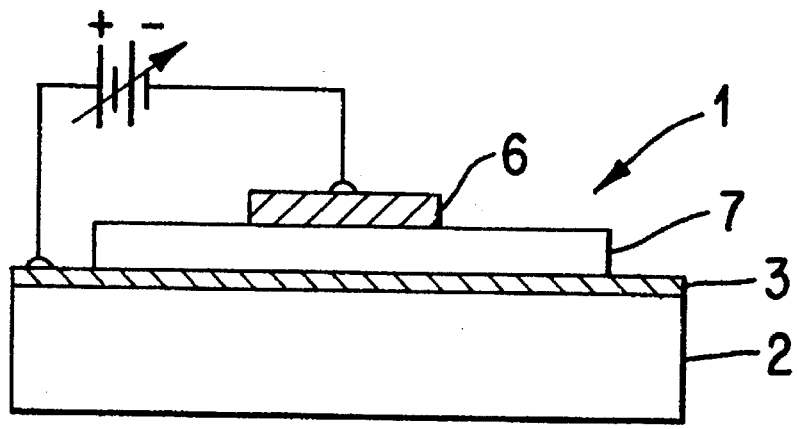

FIG. 2 illustrates another device of the present invention. In FIG. 2, elements identified with like numbers to the elements of FIG. 1 are the same elements as depicted in FIG. 1. The EL device of FIG. 2 is a single layer solid state light emitting diode 1 comprised of supporting substrate 2, anode 3, cathode 6 and combined organic layer 7. In FIG. 2, the single layer 7 comprises a hole transport polymer, an electron transport material (host material) and an emitter. The single layer 7 can be solution coated as part of the sol-gel process of this invention by using common techniques such as spin casting, dip coating, gravure coating, etc.

The sol-gel process starts with materials that are soluble in organic solvents. The materials are easily convertible to metal oxides by chemical and/or physical methods. Common molecular precursors that combine these properties are alkoxides of the general formula $M(OR)_n$ where M not only means metal atoms but also other elements such as silicon, phosphorus or boron. Metal alkoxides of nearly all elements are known. Because these materials are commercially available in high purity, they comprise the main starting materials for the sol-gel process of the present invention. Preferred are metal alkoxides and organo orthosilicates. The most preferred alkoxides are metal tertiary alkoxides, organo orthosilicates, metal ethoxides, metal methoxides, metal propoxides, aluminum sec-butoxide, metal tetraethyl orthosilicate, zirconium-n propoxide, hafnium alkoxide and mixtures thereof.

Conversion of a molecular solution of a metal alkoxide to a gel is achieved through reduction of the pure or dissolved alkoxide with water. A corresponding metal oxide then forms by heat treatment.

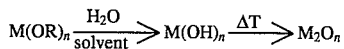

$$M(OR)_n \xrightarrow[\text{solvent}]{H_2O} M(OH)_n \xrightarrow{\Delta T} M_2O_n$$

During the step of forming the metal oxide by heat treatment, the transformation of the gel to a ceramic occurs by annealing. An amorphous, loose-packed network of wet gel is dried and then step by step solidified while remaining water and the last traces of organic material from alcohol and solvent molecules are removed from inside the pores of the drying gel. See Reuter, Advanced Materials, 11, 258 and 568 (1991), the disclosure of which is totally incorporated herein by reference.

Gel is formed in a first conversion step comprising a first hydrolysis step wherein water is added to the alkoxide with heating to an appropriate temperature, which can readily be selected by one of ordinary skill in the art. An exemplary temperature is 80° C. A sol is then formed by a further hydrolysis (peptization) step by adding water under acidic conditions as described by Clark et al., U.S. Pat. No. 4,921,731, the disclosure of which is totally incorporated herein by reference. The combined first hydrolysis step and further hydrolysis (peptization) step are hereinafter referred to as the "hydrolysis." The resulting sol is composed of colloidal particles that may be approximately 100 Å in diameter that are suspended in a water-alcohol medium.

The sol can be utilized for preparing of layers of a wide range of materials for an EL device. Examples of materials include alumina, zirconia, hafnia, lanthania, urania, titania, thoria, tantalum oxide, germania, silica and mixtures thereof.

The organometallic compound can be utilized in the sol in an amount between 0.01 wt. % and about 50 wt. % of the sol. A still more preferred amount is between 0.1 wt. % and about 40 wt. % and a still more preferred amount is between 1 wt. % and about 30 wt. %.

The particle sizes for the colloidal particles in the sol can be between about 0.0005 micron and about 10 microns. Still more preferred particle sizes are between about 0.005 micron and about 1 micron. The best results are obtained with a range of particle sizes of between about 0.01 micron and about 0.1 micron. These ranges of particle sizes result in layers that are in intimate contact with one another. The layers have excellent adhesion and smooth appearance. The layers are tightly sealed and are characterized by the tight seal, wear resistance and anti-corrosion and insulating properties.

The sol can be used to form the layers of the EL device by incorporation of the electroluminescent-functioning materials. A porphyrinic compound, hole transport conjugated polymer, charge transport material and/or organic emitter layer-forming material can be added to the sol. The sol is then solution coated by known processes such as spin casting, dip coating, gravure coating and the like. The film is then annealed at elevated temperatures. The annealing step can comprise a two step process of first drying the film followed by a calcining at a higher temperature to produce a aramic-like film. The drying step can be conducted at a temperature in the range of about 50° to about 100° C. Temperature in the calcining may vary between about 20° C. to about 150° C. and depends upon the solvent and precursor used. The preferred temperature is between about 25° C. and 75° C.

Exemplary processes for forming ceramic coatings using the sol gel process are disclosed by Davidge et al., U.S. Pat. No. 4,429,051, Nonaka et al., U.S. Pat. No. 4,920,093, Clark et al., U.S. Pat. No. 4,921,731, Dawes, U.S. Pat. No. 5,132,253 and Wilkes et al., U.S. Pat. No. 5,316,695, the disclosures of which are totally incorporated herein by reference.

In a multilayer EL device, the sol gel process can be utilized to form one or all of the layers of the EL device. Hence, the present invention encompasses an EL device having multiple layers comprising forming one or more layers by the sol gel process and forming one or more layers by conventional solution coating (not coating with a sol-gel). The resulting device may have one or more layers that are organic in nature and one or more layers that are ceramic in nature. The ceramic layers provide EL devices with a robustness greater than the devices solely based on organic polymers.

Exemplary EL devices that can be prepared by the process of the present invention are described as follows with reference to the Figure. Illustrative examples of supporting substrate 2 include polymeric components, glass and the like and polyesters like Mylar®, polycarbonates, polyacrylates, polymethacrylates, polysulfones, quartz, gold, aluminum and the like. Other substrates can be selected provided they are essentially nonfunctional and can support the other layers. The thickness of the substrate can be from 25 to 1000 microns or more as the structural demands on the device may be.

Anode 3, contiguous to substrate 2, includes positive charge injecting electrodes such as indium tin oxide, tin oxide, gold, platinum or other materials including conductive n-conjugated polymers such as polyaniline polypyrrole, etc. with a work function equal to or greater than 4 electron volts. The thickness of the anode 3 can range from about 10 to 5000 Å with a preferred range dictated by the optical constants of the anode material.

The hole injecting conductive layer 4 may comprise a porphyrinic compound. A porphyrinic compound is any compound derived from or including the porphyrine structure. Preferred examples of porphyrinic compounds are metal free phthalocyanines and metal containing phthalocyanines. While the porphyrinic compounds in general and the phthalocyanines in particular can contain any metal, the metal preferably has a positive valence of two or higher. The metal can be cobalt, magnesium, zinc, palladium, nickel, copper, lead or platinum.

The hole injecting conductive layer 4 may be a single layer or may be a combined layer constructed of a hole injecting layer and a hole transporting layer. The hole transporting layer can contain at least one hole transporting aromatic tertiary amine within the organic or ceramic structure. Suitable aromatic tertiary amines include the tertiary amines disclosed by Tang et al. and Scozafava et al.

The active hole transport/emitting organic layer 5 may be comprised of a hole transport conjugated polymer with or without an electron transport dopant. The layer 5 can be ceramic with a dispersed hole transport conjugated polymer. Examples of hole transport conjugated polymers include electroactive conjugated polymers comprised of phenyl substituted derivatives of conjugated poly(p-phenylene vinylene), and preferably poly(1,4-phenylene-1'2'-diphenyl vinylene), PPV-P, poly(1,4-phenylene-1'-phenyl vinylene), PPV-PP, and mixtures thereof. See J. H. Burroughes et al., Nature, Supra and D. Braun and A. J. Heeger, Applied Physics Letters, supra, the disclosures of which are totally incorporated herein by reference. Preferred materials for the active hole transport/emitting layer 5 are polymeric aryl tetra-substituted biphenyldiamines disclosed in U.S. Pat. Nos. 4,806,443 to Yanus et al., 4,806,444 to Yanus et al., 4,818,650 to Limburg et al. and 5,030,532 to Limburg et al.

The emitter is present in an amount of 0.01 to about 5 wt. % and preferably from about 0.1 to about 1 wt. % of the host polymer or ceramic material. Examples of emitters or fluorescent dyes are shown by Tang et al. and include known compounds selected for this purpose such as coumarin dyes such as 7-diethylamino-4-methylcoumarin, 4,6-dimethyl-7-ethylaminocourmain, 4-methylumbelliferone and the like, fluorescent 4-dicyanomethylene- 4H-pyrans such as 4-(di-cyanomethlene)2-methyl-6-(p-dimethylaminostyryl)-4H-pyran and the like, polymethine dyes such as cyanines, merocyanines, complex cyanines and merocyanines, oxonals, hexioxonols, styryls, merostyryls, streptocyanines and the like.

The weight ratio of the hole transport polymer to the electron transport conjugated compound is from about 100:1 to 1:2 and preferably 10:1 to 1:1. The thickness of the active layer can typically be from about 100 Å to 5,000 Å, and preferably from about 300 Å to about 2000 Å.

The cathode 6 is conveniently formed by deposition on the upper layer of the hole transport/emitting layer 5. Cathode 6 is preferably comprised of magnesium, calcium, and aluminum. The cathode 6 is of a thickness of for example from about 10 Å to 5,000 Å. The cathode 6 can be constructed of any metal including any high or low work function metal useful for this purpose. The cathode can be formed from a combination of a low work function metal and at least one other metal. A low work function metal is a metal having a work function of less than 4 eV. The lower the work function of the metal, the lower the voltage required for electron injection into the hole transport/emitting layer 5.

Both anode 3 and cathode 6 of the ceramic or organic/ceramic EL device can take any convenient form. A thin conductive layer can be coated onto a light transmissive substrate, for example a transparent or substantially transparent glass plate or plastic film. The EL device can include a light transmissive anode 3 formed of tin oxide or indium tin oxide coated on a glass plate. Any light transmissive polymeric film can be employed as the substrate. Further suitable forms of the anode 3 and cathode 6 are illustrated by Tang et al.

The process of the present invention comprises forming a film-forming sol containing an active electroluminescent material such as a porphyrinic compound, a hole transporting mater, an emitter or an electron transport compound and heating the sol to form a ceramic electroluminescent-active layer. The sol can be formed by hydrolysis, the porphyrinic compound, the hole transport polymer and/or the emitter can be added to the sol and the sol applied as a film to a supporting substrate. The sol is dried and calcined to form a ceramic electroluminescent-active layer. The electroluminescent-active layer can be any of a single electroluminescent-functioning layer such as a hole injecting layer or an emitting layer or the electroluminescent-functioning layer can be a combined hole transport/emitting layer as described aforesaid.

Other layers can be solution coated onto the ceramic film layer. The additional solution coated layers can also be subjected to a sol-gel process or the additional layers need not be subjected to the sol-gel process. The process of the invention including the sol-gel steps can be used to form a device comprising a cathode and an anode and a single multi-functional organic layer that comprises at least a hole transport material, a charge transport material and an emitter. Most advantageously, the process of the invention is used to produce EL devices comprising multiple layers. At least one of the multiple layers will be subjected to the sol-gel processing of the present invention. In embodiments of the present invention, all of the layers can be applied by sol-gel processing or some of the layers can be applied by sol-gel processing. In any instance, the process of the present invention advantageously forms an EL device via a solvent coating process without the disadvantages of conventional solution coating processes.

Preferred embodiments have been described above with reference to FIG. 1. FIG. 1 includes a separate hole injecting conductive layer 4 and hole transport/emitting layer 5. The above description of preferred embodiments also applies to the EL diode shown in FIG. 2. In FIG. 2, the EL diode 1 comprises a combined conductive layer 7 that includes hole ejecting, hole transport and emitting functions. The exemplary and preferred materials and construction for this layer include the exemplary and preferred materials and constructions for the hole injection conductive layer 4 and the hole transport/emitting layer 5 described with reference to FIG. 1.

In embodiments, an EL device can be prepared to electroluminesce at wavelengths longer than the intrinsic luminescence of the polymer selected by doping the polymer with small effective amounts, for example from about 0.1 to about 5 weight percent, of fluorescent organic molecules like those illustrated by Tang et al. Another advantage of the method of the present invention is that the emission of an emitting layer can be altered to change bandgap by doping the solution emitting layer prior to gelation.

The following Example is provided to further define various aspects of the present invention. Parts and percentages are by weight unless otherwise indicated.

EXAMPLE

Aluminum sec-butoxide is hydrolyzed at about 80° C. to form a sol with about 10 wt. % organometallic compound. One wt. % of 7-diethylamino- 4-methyl coumarin emitter is added to the sol. The sol is spin coated onto a hole transporting layer containing an aromatic tertiary amine. The spin coated layer is dried and then calcined at about 600° C. An approximately 150 Å thick layer of Mg is vapor deposited on top of the layer. The resulting electrode is coated with a layer of Ag and the device is mounted in a sample box. A voltage is applied and luminescence is observed.

Other modifications of the present invention will occur to those skilled in the art subsequent to a review of the present application. These modifications and equivalents thereof are intended to be included within the scope of this invention.

What is claimed is:

1. A method of preparing an electroluminescent device, comprising forming a film-forming sol by heating a metal alkoxide in solution with water to form a gel and adding additional water under acidic conditions; forming on a substrate, a film of said film-forming sol containing an electroluminescent-active material comprising a porphyrinic compound, a hole transporting material, an emitter or an electron transport compound and heating said sol to form a ceramic electroluminescent-active device.

2. The method of claim 1, comprising applying said sol on an electrode layer.

3. The method of claim 1, comprising forming said sol on a previously-formed organic layer.

4. The method of claim 1, additionally comprising applying said sol to a layer by spin coating prior to said heating.

5. The method of claim 1, comprising doping said sol with a band gap altering dopant prior to forming said device.

6. The method of claim 1, wherein said film-forming sol comprises a metal alkoxide and an organic dopant, said sol is applied to a formed layer to form said film.

7. The method of claim 4, additionally comprising forming an organic layer on said film.

8. The method of claim 1, wherein said sol is applied to an electrode layer to form said film and heating said sol forms a ceramic film, and a further electrode layer is applied to said ceramic film to form said device.

* * * * *